United States Patent
Johnson et al.

(10) Patent No.: US 11,460,503 B2
(45) Date of Patent: Oct. 4, 2022

(54) BATTERY ELECTROMECHANICAL SWITCHING DEVICE DIAGNOSTICS SYSTEM AND METHODS

(71) Applicant: CPS Technology Holdings LLC, New York, NY (US)

(72) Inventors: Mark R. Johnson, Milwaukee, WI (US); Michael R. Blemberg, Shorewood, WI (US); Ronald J. Dulle, Mequon, WI (US); Steven G. Rinaldo, Milwaukee, WI (US); Zhihong Jin, Pewaukee, WI (US); Douglas G. Grimsley, Glendale, WI (US)

(73) Assignee: CPS Technology Holdings LLC, New York, NY (US)

( * ) Notice: Subject to any disclaimer, the term of this patent is extended or adjusted under 35 U.S.C. 154(b) by 123 days.

(21) Appl. No.: 16/606,122

(22) PCT Filed: Apr. 20, 2018

(86) PCT No.: PCT/US2018/028664
§ 371 (c)(1),
(2) Date: Oct. 17, 2019

(87) PCT Pub. No.: WO2018/195490
PCT Pub. Date: Oct. 25, 2018

(65) Prior Publication Data
US 2020/0371160 A1   Nov. 26, 2020

Related U.S. Application Data

(60) Provisional application No. 62/616,308, filed on Jan. 11, 2018, provisional application No. 62/488,224, filed on Apr. 21, 2017.

(51) Int. Cl.
*G01R 31/00*   (2006.01)
*G01R 31/327*   (2006.01)
(Continued)

(52) U.S. Cl.
CPC ........ *G01R 31/3275* (2013.01); *B60L 3/0023* (2013.01); *B60L 58/10* (2019.02); *G01R 31/3278* (2013.01); *H02J 7/0029* (2013.01)

(58) Field of Classification Search
USPC .......... 324/424, 415, 426, 430–435; 361/86; 307/10.1, 80; 320/117, 124, 128, 132,
(Continued)

(56) References Cited

U.S. PATENT DOCUMENTS 5,418,402 A * 5/1995 Fujiwara ............... H02J 7/1438
307/10.1
5,691,619 A * 11/1997 Vingsbo ................ H02J 7/1461
361/86

(Continued)

FOREIGN PATENT DOCUMENTS

| CN | 103344911 A | 10/2013 |
| CN | 104062582 A | 9/2014 |

(Continued)

OTHER PUBLICATIONS

International Search Report and Written Opinion of the international Search Authority dated Aug. 22, 2018, for PCT/US2018/028664 filed Apr. 20, 2018, 16 pgs.

*Primary Examiner* — Vincent Q Nguyen
(74) *Attorney, Agent, or Firm* — Boardman & Clark LLP

(57) ABSTRACT

An electrical system comprising a battery system and a control system is disclosed. The battery system may comprise a first switching device, a first battery electrically coupled in series with the first switching device, a second battery electrically coupled in parallel with the first switching device and the first battery when the first switching device is in a closed position, and a second switching device coupled in series with a load. The control system may be configured to perform diagnostics on the battery system.

19 Claims, 11 Drawing Sheets

(51) Int. Cl.
*B60L 58/10* (2019.01)
*B60L 3/00* (2019.01)
*H02J 7/00* (2006.01)

(58) Field of Classification Search
USPC .................................................. 320/134, 136
See application file for complete search history.

(56) References Cited

U.S. PATENT DOCUMENTS

| | | |
|---|---|---|
| 2011/0026054 A1 | 2/2011 | Weng |
| 2012/0306275 A1* | 12/2012 | Christensen ........ H01M 10/482 |
| | | 307/80 |
| 2016/0336736 A1 | 11/2016 | Nomura et al. |

FOREIGN PATENT DOCUMENTS

| | | |
|---|---|---|
| CN | 104827912 A | 8/2015 |
| CN | 104835683 A | 8/2015 |
| EP | 2946976 A2 | 11/2015 |

\* cited by examiner

BATTERY ELECTROMECHANICAL SWITCHING DEVICE DIAGNOSTICS SYSTEM AND METHODS

REFERENCE TO PRIORITY APPLICATION

This application claims priority as a national phase filing of International Application No. PCT/US2018/028664 which has an international filing date of Apr. 20, 2018, which claims priority to U.S. Provisional Patent Application Nos. 62/488,224 filed Apr. 21, 2017 and 62/616,308 filed Jan. 11, 2018 the entirety of all of which are incorporated herein by reference.

FIELD

This application relates to the field of batteries; more specifically this application relates to the field of battery diagnostics.

BACKGROUND

Generally, a battery system may include one or more batteries that store electrical energy. Thus, battery systems are often implemented in electrical systems. In particular, using stored electrical energy, a battery may supply electrical power to an electrical load in the electrical system, thereby discharging the battery. Additionally, the battery may capture electrical power received from an electrical source (e.g., generator) in the electrical system as electrical energy, thereby charging the battery.

In some instances, the battery system may include an electromechanical switching device (e.g., relay or contactor) electrically coupled between the battery and an electrical device (e.g., load or source) of the electrical system to facilitate controlling supply of electrical power to the battery and/or from the battery. For example, in a closed position, the electromechanical switching device may electrically connect the battery to the electrical device. In other words, closing the electromechanical switching device may enable current flow and, thus, charging/discharging of the battery. On the other hand, in an open position, the electromechanical switching device may electrically disconnect the battery from the electrical device. In other words, opening the electromechanical switching device may block (e.g., disable) current flow and, thus, charging/discharging of the battery cells.

To facilitate improving operational reliability, diagnostics may be performed on the battery system. For example, diagnostics may be performed to determine whether the electromechanical switching device is in the closed position or the open position. In other words, battery diagnostics may be performed to determine whether or not the battery cells are available for use by a system.

Whether a battery is available for use may be of particular importance, for example, in an automotive context. Battery power may be required to crank or start a vehicle and support standard vehicle functionality such as air conditioning. In addition, battery systems may be used to support advanced vehicle functionality. This functionality may include lane-assist, cruise control, and active suspension, among other features. Power failure to these advanced features can lead to failure of these features and potential driver complications.

Further, as advanced systems and functionality become increasingly common, vehicles depend on electrical systems for safety-critical loads. For example, lane-assist and to a greater extent autonomous steering technology may require the vehicle system to provide consistent power to a steering module within the vehicle. Drivers may rely on this capability of the vehicle. For example, in semi-autonomous and fully autonomous vehicles having advanced vehicle systems, drivers may rely on these systems for safe operation of a vehicle. Accurate battery diagnostics including state status of battery (or more generally power) availability may therefore be important to ensuring safe operation of a vehicle.

Known diagnostics may be insufficient in certain cases to detect battery availability. For example, known diagnostics may be compromised when current flow through the battery is approximately zero regardless of whether the electromechanical switching device is in the open position or the closed position. Such limitations decrease accuracy of system information regarding the availability of a power source which may lead to safety risks in the electrical system of a vehicle.

SUMMARY

Therefore, what is disclosed is an improved battery diagnostics system and method. The improved battery diagnostics system and method may be used, for example, in an electrical system to indicate availability of one or more power sources. The improved battery diagnostics system and method may allow for identification of the availability of a power source to support vehicle functionality. The availability of a power source may be identified using evaluation of the open or closed state of one or more switches in a circuit. In particular, the disclosed system and method may offer improved reliability of results regarding battery status when current flow through the battery is approximately zero regardless of whether the electromechanical switching device is in the open position or the closed position.

In various embodiments, the improved battery diagnostics system and method may be used in a vehicle to enable vehicle functionality which may include advanced vehicle features. Therefore, the improved battery diagnostics system and method may provide for a higher level of accuracy in determining the availability of the power source for these functionalities.

The improved battery diagnostics system and method may include one or more switches in a circuit having at least two voltage sources. In various embodiments, the battery system includes a first battery, a second battery, a first switching device, a second switching device, and a sensor communicatively coupled to the control system.

Disclosed is an electrical system comprising a battery system and a control system, the battery system comprising: a first switching device, a first battery electrically coupled in series with the first switching device, a second battery electrically coupled in parallel with the first switching device and the first battery when the first switching device is in a closed position, and a second switching device coupled in series with a load, a control system configured to perform diagnostics on the battery system; the control system is configured to: instruct the second switching device to close to electrically couple the second switching device and the load in parallel with the second battery, and determine an actual position of the first switching device based at least in part on current flow through the first battery while the second switching device is closed. Also disclosed is an electrical system wherein the control system is configured to instruct the second switching device to close when the battery system is in a steady-state, wherein the current flow through the first battery is approximately zero when the first switching device is in the closed position and the battery system is in the steady-state. Also disclosed is an electrical system wherein the load comprises a relay coil of the first switching device. Also disclosed is an electrical system comprising a current sensor coupled in series with the first switching device, wherein the control system is configured to determine the actual position of the first switching device based at least in part on a sensor signal received from the current sensor. Also disclosed is an electrical system wherein the current sensor comprises a shunt resistor. Also disclosed is an electrical system wherein the actual position of the first switching device can be used to determine whether the first battery and/or second battery is available for use by a vehicle. Also disclosed is a vehicle having the disclosed electrical system. Also disclosed is a vehicle wherein the electrical system is used to evaluate whether safety-critical functionality can be supported by the first battery and/or the second battery.

Disclosed is an electrical system comprising: a battery system and a control system configured to perform diagnostics on the battery system; the battery system further comprising a standalone battery module having a positive terminal, a negative terminal, a battery cell, a primary switching device electrically coupled between the battery cell and the positive terminal, and a secondary switching device electrically coupled between the battery cell and the positive terminal in parallel with the primary switching device. Also disclosed is an electrical system wherein the control system is configured to instruct the secondary switching device to close to electrically couple the battery cell to the positive terminal and determine an actual position of the primary switching device based at least in part on voltage drop across the secondary switching device while the secondary switching device is closed.

Disclosed is an electrical system comprising a battery system comprising a first battery, a first switching device electrically coupled in series with a first load, a second switching device electrically coupled in series with a second load, a second battery, a sensor, and a relay, wherein the first battery is electrically coupled in parallel with the first switching device and the second battery is electrically coupled in parallel with the second switching device, and a control system configured to perform diagnostics on the battery system, the control system is configured to determine relay status by obtaining a number of measurements of current across the battery system. Also disclosed is an electrical system wherein the sensor is a current sensor which comprises a shunt resistor. Also disclosed is an electrical system wherein the measurements include: obtaining first current measurement while the first switching device and second switching device are both in an open state, obtaining a second current measurement while the first switching device is closed and the second switching device is open, obtaining a third current measurement while the first switching device is open and the second switching device is closed. Also disclosed is an electrical system wherein the relay status can be used to determine whether a battery is available for use by a vehicle. Also disclosed is a vehicle further comprising advanced driver functionality. Also disclosed is a vehicle wherein the electrical system is used to evaluate whether safety-critical functionality can be supported by the first battery and/or the second battery.

These and other features and advantages of devices, systems, and methods according to this invention are described in, or are apparent from, the following detailed descriptions of various examples of embodiments.

BRIEF DESCRIPTION OF THE DRAWINGS

Various examples of embodiments of the systems, devices, and methods according to this invention will be described in detail, with reference to the following figures, wherein.

It should be understood that the drawings are not necessarily to scale. In certain instances, details that are not necessary to the understanding of the invention or render other details difficult to perceive may have been omitted. It should be understood, of course, that the invention is not necessarily limited to the particular embodiments illustrated herein.

DESCRIPTION

Figure 1:
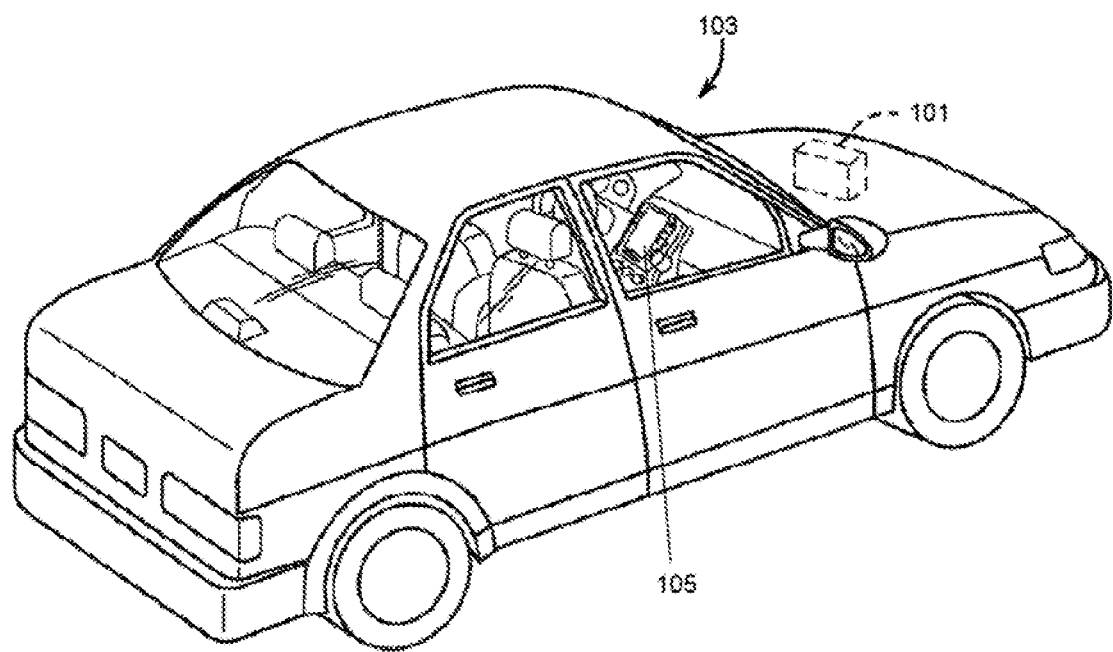
FIG. 1 shows a view of a battery system in a vehicle according to one or more examples of embodiments described herein.

The present disclosure provides techniques to facilitate improving battery system diagnostics, for example, by improving electromechanical switching device state detection accuracy. Accurate electromechanical switching device state detection allows for an electrical system to identify if a particular voltage source (i.e. a battery) is available for use. As shown in FIG. 1, a battery system 101 may be provided in a vehicle 103. The battery system 101 may be used to support vehicle electrical functionality, including but not limited to advanced vehicle functionality 105, an ignition system 119, and standard vehicle functionality including displays 129. As discussed above, advanced vehicle functionality may include semi-autonomous or fully-autonomous functionality such as corrective steering or lane assist technologies.

Figure 2:
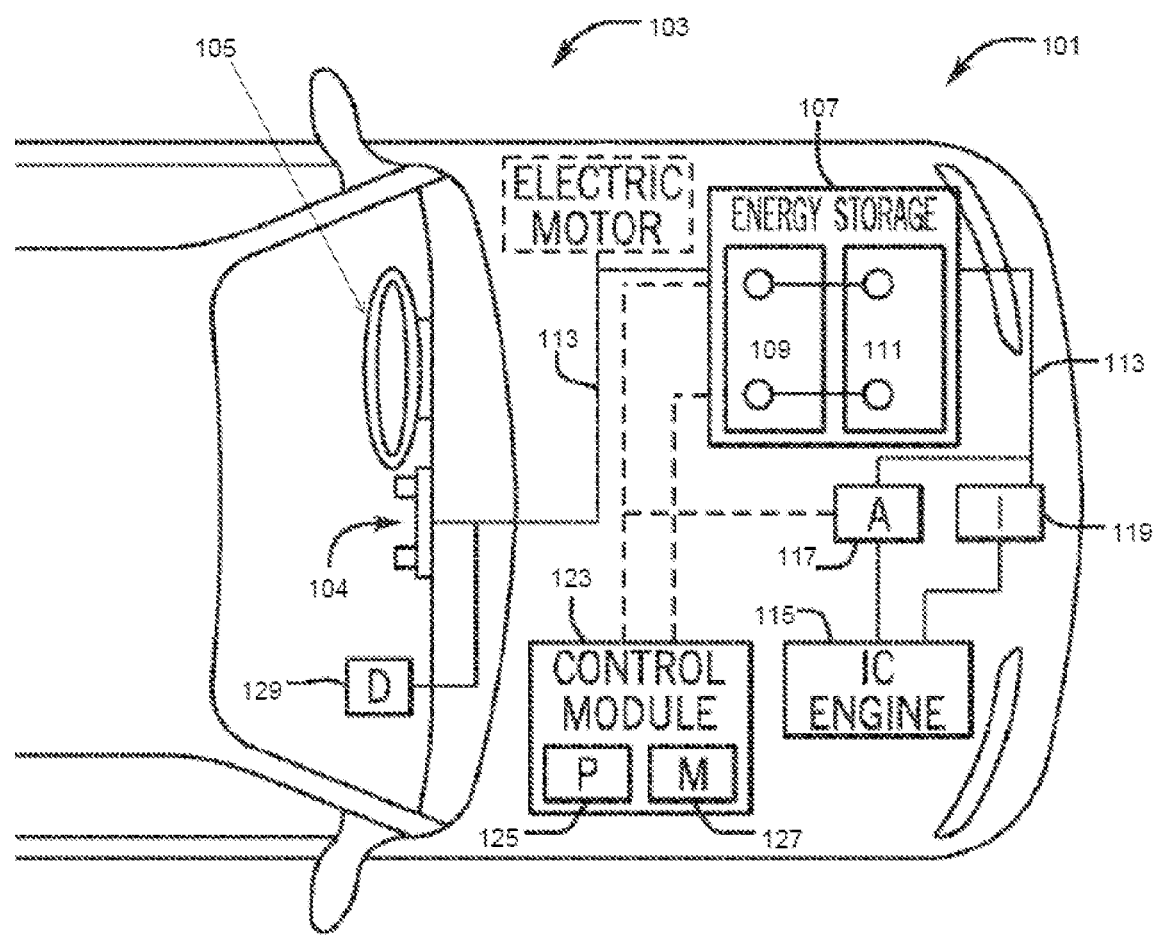
FIG. 2 shows a cut-away view of a battery system in a vehicle, according to one or more examples of embodiments described herein.

FIG. 2 shows a cut-away of the vehicle 103 having a battery system 101 for electrical communication with the vehicle 103. The battery system 101 may include a first battery module 109 and second battery module 111 which may comprise an energy storage component 107. The vehicle 103 may further comprise an engine 115, alternator 117, ignition system 119, and control module 123 which may have a processor 125 and memory 127. The energy storage component 107 may electrically couple to the vehicle's electrical system by way of a bus 113. This may allow for powering of vehicle functionality including electrical devices such as the vehicle display 129 and advanced vehicle functionality 105.

Figure 3:
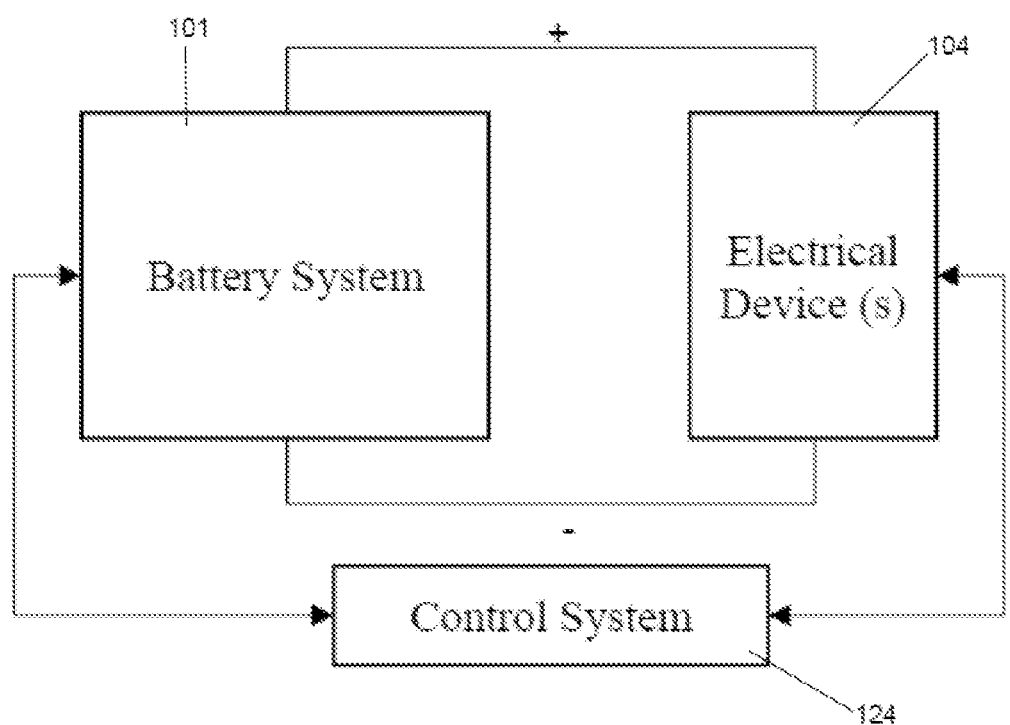
FIG. 3 shows a diagram of an electrical system for use with the system and method herein, according to one or more examples of embodiments described herein.

FIG. 3 shows a simplified electrical system 201. A battery system 101, control system 124 (which may include a control module 123), and electrical devices 104 (such as advanced functionality systems 105 and standard systems including displays 129) are seen in electrical communication with one another. In some embodiments, the electrical system may be included in an automotive vehicle 103 or the like. Additionally, in some embodiments, the electrical devices may include an electrical load and/or an electrical source (e.g., generator) 203.

Furthermore, in some embodiments, the control system 124 may control operation of the battery system 101 and/or the electrical devices 104. For example, in an automotive vehicle 103, the control system 124 may include a battery management system (BMS) and/or a vehicle control unit (VCU). In some embodiments, the control system 124 may additionally or alternatively perform diagnostics on the battery system 101, for example, to determine state (e.g., position) of an electromechanical switching device implemented in the battery system.

Figure 4:
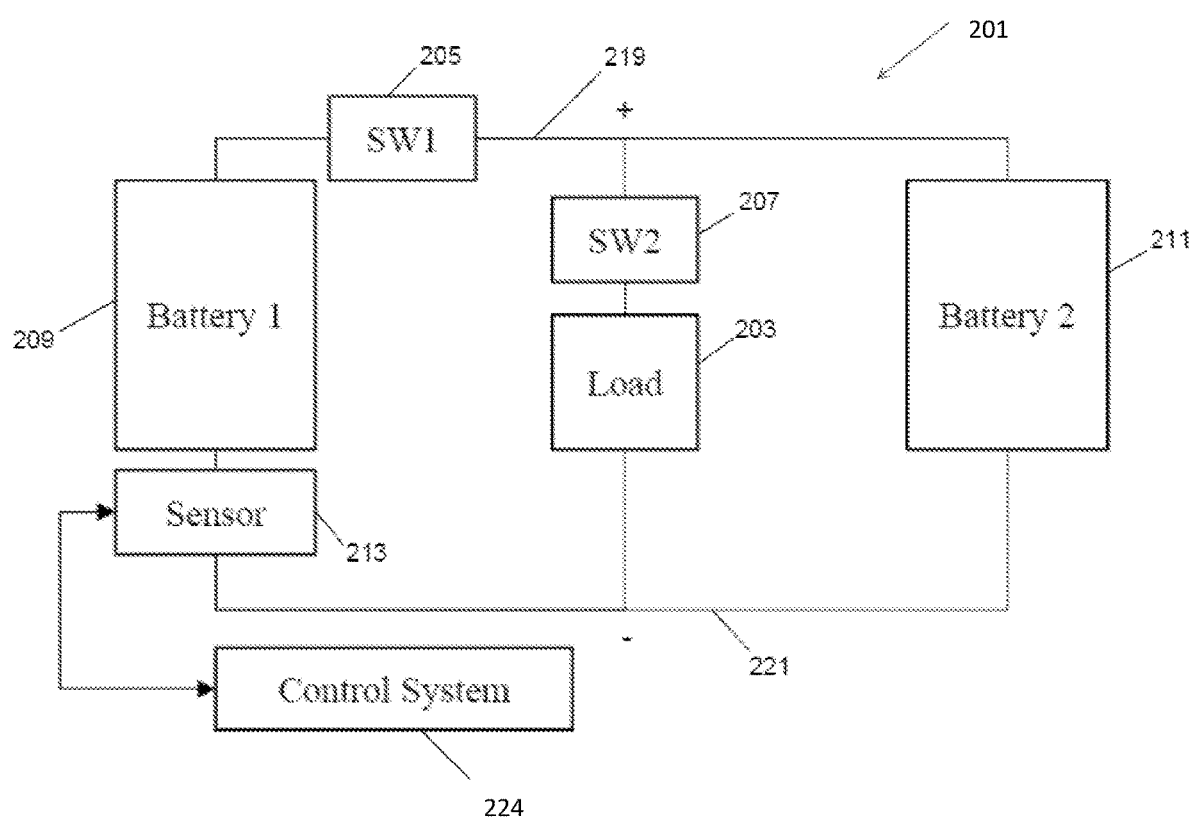
FIG. 4 shows a diagram of a battery system, according to one or more examples of embodiments described herein.

A more detailed view of a battery system according to various embodiments is shown in FIG. 4. In the depicted embodiment, the battery system includes a first battery 209, a second battery 211, a first switching device 205, a second switching device 207, and a sensor 213 communicatively coupled to the control system 224. In some embodiments, the first battery 209 and the second battery 211 may be implemented by battery cells in one or more battery modules (109, 111). For example, the first battery 209 may be implemented in a first battery module 109 while the second battery 211 is implemented in a second battery module 111. Additionally or alternatively, the first battery 209 and the second battery 211 may be implemented in the same battery module.

As described above, the control system 224 may control operation of the battery system 201. For example, the control system 224 may instruct the first switching device 205 to switch from an open position to a closed position or from the closed position to the open position. In some embodiments, the first switching device 205 may be an electromechanical switching device, such as a bi-stable relay. Additionally or alternatively, the control system may instruct the second switching device 207 to switch from an open position to a closed position or from the closed position to the open position. In some embodiments, the second switching device may be a semiconductor switching device, such as a metal-oxide-semiconductor field-effect transistor (MOSFET) or a bipolar junction transistor (BJT).

In addition to controlling operation, the control system 224 may perform diagnostics based at least in part on operational parameters of the battery system 201. Thus, to facilitate performing diagnostics, the control system 224 may receive sensor signals from the sensor 213 indicative of battery system 201 operational parameters. For example, based on sensor signals received from the sensor 213 (e.g., shunt resistor), the control system may determine current flow through the first battery 209.

In particular, when in a closed position, the first switching device 203 may enable current flow through the first battery 209. Thus, the control system 224 may determine that the first switching device 203 is in the closed position when sensor signals received from the sensor 213 indicate that current flow through the first battery 209 is greater than a threshold current (e.g., 0 amps). Additionally, when in an open position 217, the first switching device 205 may block (e.g., disable) current flow through the first battery 209. Thus, in some embodiments, the control system 224 may determine that the first switching device 203 is in the open position 217 when sensor signals received from the sensor 213 indicate that current flow through the first battery 209 is not greater than the threshold current.

However, in some instances, current flow through the first battery 209 may not be greater than the threshold current even when the first switching device 205 is in the closed position 215. For example, when an automotive vehicle is in a key off state, the battery system may continue supplying electrical power to one or more electrical devices 204. When the first switching device is in the closed position 215, the first battery 209 and/or the second battery 211 may output electrical power until a steady-state (e.g., equilibrium) is reached, for example, due energy transfer between the first battery 209 and the second battery 211. In some instances, in the steady-state, voltage of the first battery 209 and voltage of the second battery 211 may be approximately equal, thereby resulting in current flow in the battery system 201 and, thus, current flow through the first battery 209 to be approximately zero even when the first switching device 205 is in the closed position 215.

In other words, when the battery system 201 is in the steady-state, current flow through the first battery 209 may be approximately zero regardless of whether the first switching device 205 is in the open position 217 or the closed position 215. Additionally, as described above, current flow through the first battery 209 may also be approximately zero when the first switching device 205 is in the open position 217 regardless of whether the battery system 201 is in the steady-state. Accordingly, known systems and methods may cause the control system 224 to have difficulty determining position of the first switching device 205 when the battery system is in the steady-state.

To facilitate determining position of the first switching device 205, the control system 224 may control switching of the second switching device 207. Generally, the control system 224 may maintain the second switching device 207 in an open position 217, thereby disconnecting the load from a positive bus 219 or a negative bus 221. When the second switching device 207 is switched to the closed position 215, the load 203 may be electrically coupled between the positive bus 219 and the negative bus 221, thereby resulting in electrical current flowing through the load 203. In fact, introducing the load may result in battery system 201 exiting the steady-state. For example, when the battery system 201 is in the steady-state and the first switching device 205 is in the closed position 215, closing the second switching device 207 to introduce the load 203 may result in current flowing through the first battery 209 and the second battery 211.

Thus, in some embodiments, the control system 224 may instruct the second switching device 207 to close each time the position of the first switching device 205 is to be determined. As described above, when the battery system 201 is not in the steady-state, current flow through the first battery 209 may be indicative of the position of the first switching device 205. Thus, in some embodiments, the control system may determine whether the battery system 201 is expected to be in the steady-state and instruct the second switching device 211 to close when the battery system 201 is expected to be in the steady-state and the position of the first switching device 205 is to be determined. Operating in this manner may facilitate reducing power consumption by enabling duration the load 203 is connected to be reduced.

Introducing the load 203 may enable the control system 224 to determine position of the first switching device 205 even when the battery system 201 would otherwise be in the steady state. For example, while the load 203 is connected, the control system 224 may determine that the first switching device 205 is in the closed position 215 when current flowing through the first battery 209 is greater than a threshold current (e.g., zero amps). On the other hand, the control system 124 may determine that the first switching device 209 is in the open position 217 when current flowing through the second battery 211 is not greater than the threshold current.

Additionally, in some embodiments, the load 203 selectively connected by the second switching device 207 may be an existing component in the battery system 201. For example, the load 203 may be a relay coil 204 of the first switching device 205. In such embodiments, the control system 124 may instruct the second switching device to pulse the relay coil such that electrical power supplied to the relay coil 204 is insufficient to switch the first switching device 205. Implementing the load in this manner may facilitate reducing implementation associated cost, such as component count in the battery system 201, manufacturing steps to assemble battery system 201, and/or size (e.g., footprint) of the battery system 201.

Moreover, determining position of the first switching device 205 may facilitate performing other diagnostics. For example, the control system 224 may determine that the first switching device 205 is welded or otherwise undesirably held in the closed position 215 when the first switching device 205 is expected to be in the open position 217, but the sensor signals indicate that the first switching device 205 is actually in the closed position 215. Additionally or alternatively, the control system 124 may determine that first switching device 205 is obstructed or otherwise undesirably held in the open position 217 when the first switching device is expected to be in the closed position 215, but the sensor signals indicate that the first switching device 205 is actually in the open position 217.

Figure 5:
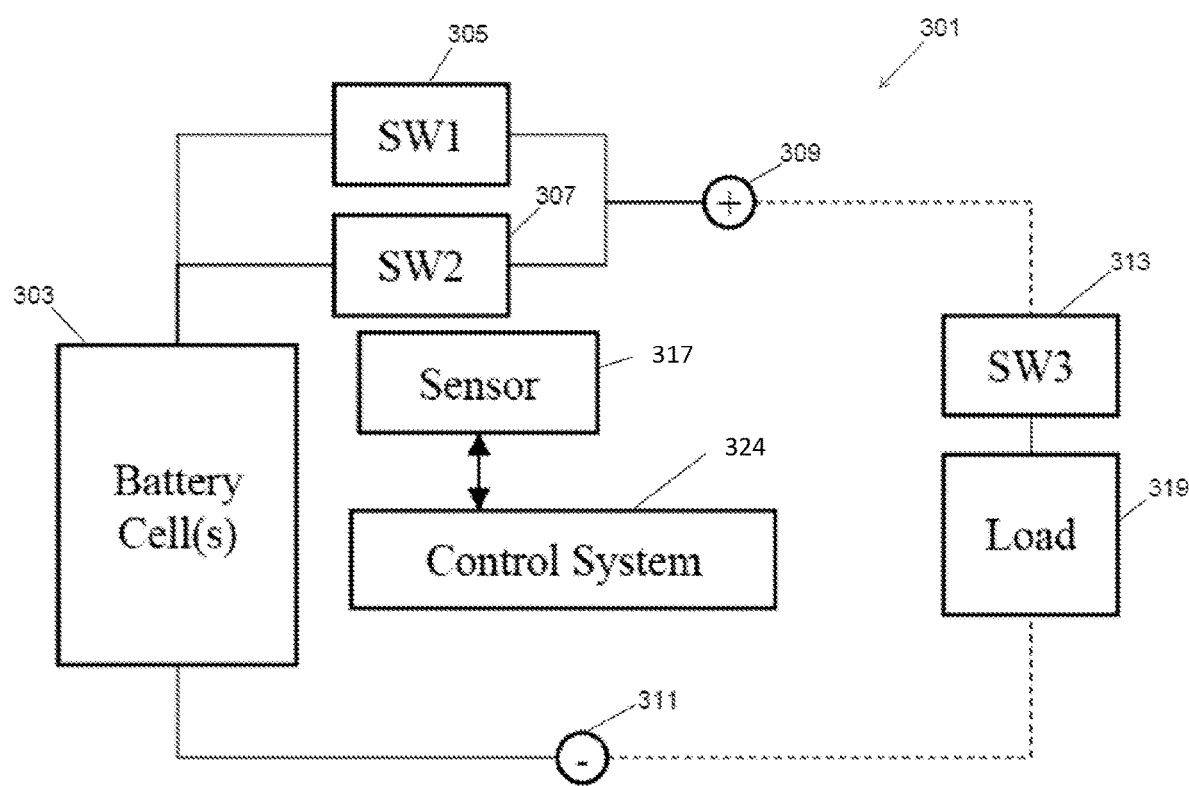
FIG. 5 shows a second diagram of a battery system, according to one or more examples of embodiments described herein.

In addition to facilitating diagnostics on multi-battery battery systems, the present disclosure provides techniques to facilitate diagnostics on a single (e.g., standalone) battery. To help illustrate, a standalone battery system 301 is shown in FIG. 5.

As depicted, the standalone battery module 301 includes one or more battery cells, a primary switching device 305, and a secondary switching device 307. In particular, in the depicted embodiment, the primary switching device 305 and the secondary switching device 307 are coupled in parallel between the battery cells 303 and a positive terminal 309 of the battery module 301. In other embodiments, the primary switching device 305 and the secondary switching device 307 may be coupled in parallel between the battery cells 303 and a negative terminal 311 of the battery module 301.

Additionally, in some embodiments, the primary switching device 305 and/or the secondary switching device 307 may facilitate controlling direction of current flow through the battery cells 303. For example, the secondary switching device 307 may include a diode implemented to enable current flow from the battery cells 303 to the positive terminal 309, thereby enabling only discharging the battery cells 303 through the secondary switching device 307. Alternatively, the secondary switching device 307 may include a diode implemented to enable current flow from the positive terminal 309 to the battery cells 303, thereby enabling only charging the battery cells 303 through the secondary switching device 307.

Furthermore, in some embodiments, the primary switching device 305 and/or the secondary switching device 307 may facilitate controlling magnitude of current flow through the battery cells 303. For example, the primary switching device 305 and the secondary switching device 307 may be implemented such that, when closed, the secondary switching device 307 limits magnitude of current flow compared to the primary switching device 305. In other words, in some embodiments, the primary switching device 305 may be closed when higher magnitude current flow through the battery cells 303 is desired, for example, to crank an internal combustion engine, and the secondary switching device 307 may be closed when lower magnitude current flow through the battery cells 303 should be sufficient, for example, to power a radio during vehicle key off. Thus, in some embodiments, the primary switching device 305 may include an electromechanical switching device (e.g., relay or contactor). Additionally, in some embodiments, the secondary switching device 307 may include a semiconductor switching device, such as a metal-oxide-semiconductor field-effect transistor (MOSFET) or a bipolar junction transistor (BJT).

Diagnostics may be performed on the standalone battery module 301, for example, to determine position of the primary switching device 305 and/or whether the primary switching device 305 is operating properly. In some embodiments, voltage drop across the secondary switching device 307 may be indicative of position of the primary switching device 305. For example, when the primary switching device 305 is in an open position, voltage drop across the primary switching device 305 and, thus, voltage drop across the secondary switching device 307 may be above a threshold voltage (e.g. zero volts). On the other hand, when the primary switching device 305 is in a closed position, voltage drop across the primary switching device 305 and, thus, voltage drop across the secondary switching device 307 may not be above the threshold voltage. Therefore, the system may instruct the secondary switching device 307 to close and then determine an actual position of the primary switching device 305, secondary switching device 307, or both the primary switching device 305 and secondary switching device 307 based at least in part on the voltage drop across either the primary switching device 305 or the secondary switching device 307 while the secondary switching device 307 is closed.

In some embodiments, to facilitate drawing sufficient current from the battery cells 303 to produce a voltage drop across the secondary switching device 307, a load 319 may be selectively coupled between the positive terminal 309 and the negative terminal 311 of battery module via a third switching device 313. For example, in an open position, the third switching device 313 may electrically disconnect the load 319 from the terminals of the battery module 301. On the other hand, in a closed position, the third switching device 313 may electrically connect the load 319 from the terminals (309, 311) of the battery module 301. Thus, in such embodiments, the control system 324 may instruct the third switching device 313 to switch to the closed position when position of the primary switching device 305 is to be determined. Additionally, in some embodiments, the switchable load 319 may be an internal component of the battery module 301, for example, a relay coil of the primary switching device 305. In such embodiments, this may enable performing diagnostics before deployment of the battery module 301 in an electrical system, for example, while on the shelf. In other embodiments, the switchable load may be external from the battery module 301.

To facilitate performing diagnostics on the standalone battery module, a control system 315 may receive sensor signals from a (e.g., voltage) sensor 317 coupled across the secondary switching device 307. Based at least in part on the sensor signals, the control system 315 may determine actual position of the primary switching device 305. Moreover, the control system 315 may perform further diagnostics based at least in part on the actual position of the primary switching device 305. For example, the control system 315 may determine whether the primary switching device is operating properly by comparing the actual position of the primary switching device 305 and the expected position of the primary switching device 305.

The above-described systems and methods may have certain limitations, for example, where the difference between a first and second resistance is large. This may occur, for example, when the system comprises two batteries with increased resistance. Increases in resistance may occur, for example, at extreme temperatures (e.g. very cold temperatures). Therefore, additional features or diagnostic techniques may be useful to supplement the above. FIGS. 6A, 7A, 8, and 9 show a number of circuits for use with the foregoing system and method. Compared with the circuits (battery systems 201, 301) of FIGS. 4-5, the circuits (battery systems 401) may further comprise one or more additional loads, additional switch(es), and changes in diagnostic routine. Therefore, it should be understood the above systems and methods may be supplemented by the foregoing system and method. This is because the systems and methods described herein and below may assist with efficacy of the above systems and methods in certain circumstances. Similar techniques, goals, and features should therefore be understood to apply to the foregoing as well. These include, but are not limited to, types of voltage sources (lithium ion batteries, lead acid batteries, alternators, other voltage sources), types of loads (resistors, relay coils, equivalents thereof), types of switching devices, sensors, control systems, etc.

Figure 6A:
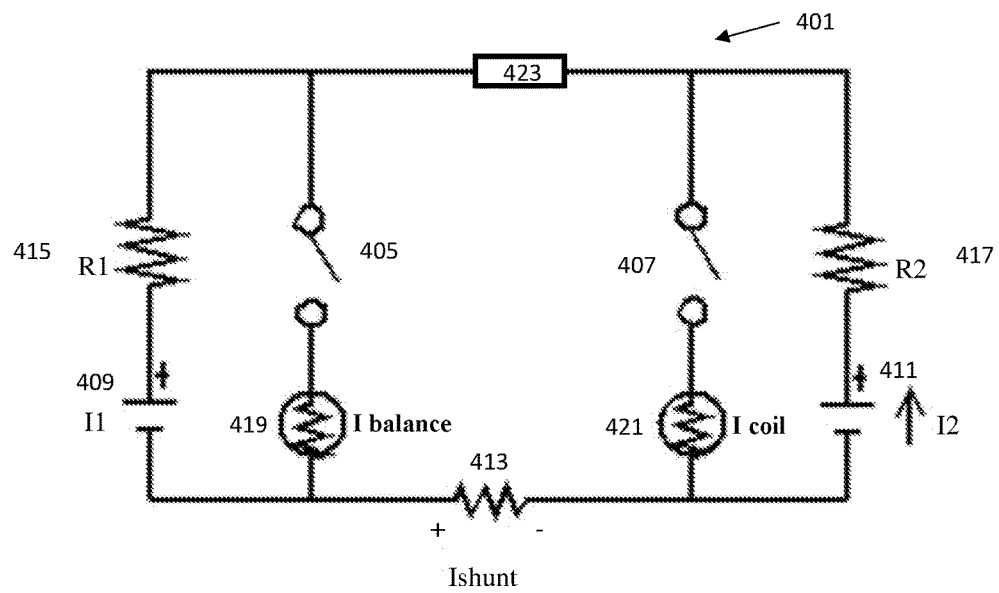
FIG. 6A shows a third diagram of a battery system, according to one or more examples of embodiments described herein.

As shown in FIG. 6A, the battery system 401 may include a first voltage source or battery 409, second voltage source or battery 411, first switching device 405, and second switching device 407, and sensor or shunt 413. The battery system may include a number of additional loads than that disclosed above. A first 415, second 417, and possibly third 419 and fourth 420 load can be seen. While certain resistors are shown and designations (R1, R2, etc.) these may be broadly understood to encompass certain loads of any type. A control system 424 may likewise be in communication with the sensor or shunt 413.

By providing one or more additional load(s) (415, 417) on the system, diagnostics may performed even when a first and second resistance of a first and second battery (409, 411) respectively are large (for example, in very cold temperatures). For example, the system and method herein in various embodiments may involve providing an additional current load (e.g. 415, 417) to the BUS side—in other words, an additional current load 415, 417 to the other side of the relay 423 and the sensor 413 (e.g. shunt), as compared to FIG. 4, for example. It should be understood that in the system of FIG. 6A, relay 423 is being evaluated for status. In FIG. 4 and FIG. 5, SW1 (205, 305) was being evaluated for status. In other words, in various embodiments, a first load may be provided on one side of the relay and shunt and a second load may be provided on the other side of the relay and shunt of the example circuits provided herein.

It should be apparent that in FIG. 6A the first voltage source 409 is electrically connected in series with a load (e.g. first resistor) 415. These are electrically connected in parallel to a first switching device 405 which may be electrically connected in series with another load (e.g. resistor I balance). The second voltage source 411 may be seen electrically connected in series with a load (e.g. second resistor) 417. These are electrically connected in parallel to a second switching device 407 which may be electrically connected in series with another load (e.g. resistor I coil). Between the switches, relay 423 may be seen. Relay 423 may constitute a circuit breaker of some kind, including but not limited to a fuse, relay, etc. Relay 423 may be provided along a BUS, which may be in certain embodiments a BUS critical to battery function. Likewise, a sensor (e.g. shunt) 413 may be seen between loads 419 and 421.

The system and method herein using both techniques may advantageously allow for evaluation of state regardless of impedance for each voltage source (e.g. 409, 411). This may allow for diagnosis even when there is a large difference in resistances between the two sides. In particular, this may allow for diagnosis where voltage between the two sources (e.g. a first 409 and second battery 411) is substantially the same but there is a large difference in resistances between the two sides. The system and method herein may be advantageous particularly where the voltage of both sides (e.g. first battery side 409 and second battery side 411 is the same, but the resistance differential is great.

In the system and method described above, the load 203 may have been incorporated on the positive side to allow for current flow on one side of the circuit 201. The foregoing system and method may therefore allow for a similar diagnostic to be run in reverse (relative to the above disclosure), looking for the current as it runs across a sensor (e.g. shunt) 413. In the event that R1 415 is much greater than R2 417 (where resistance is much greater on one side than the other), the system and method disclosed above in FIGS. 1-5 may be insufficient. In other words, the prior system may lose efficacy as the differential between the first resistance and second resistance (e.g. LI System discharge resistance and the Cell Discharge R0 Resistance ("Rpack and Rbus")) becomes very large. By using the above system and method of FIGS. 1-5 and the description thereof, along with the system and method disclosed hereafter (i.e. using both together), superior results may be achieved under certain circumstances, leading to a more reliable battery state indicator.

Figure 6B:
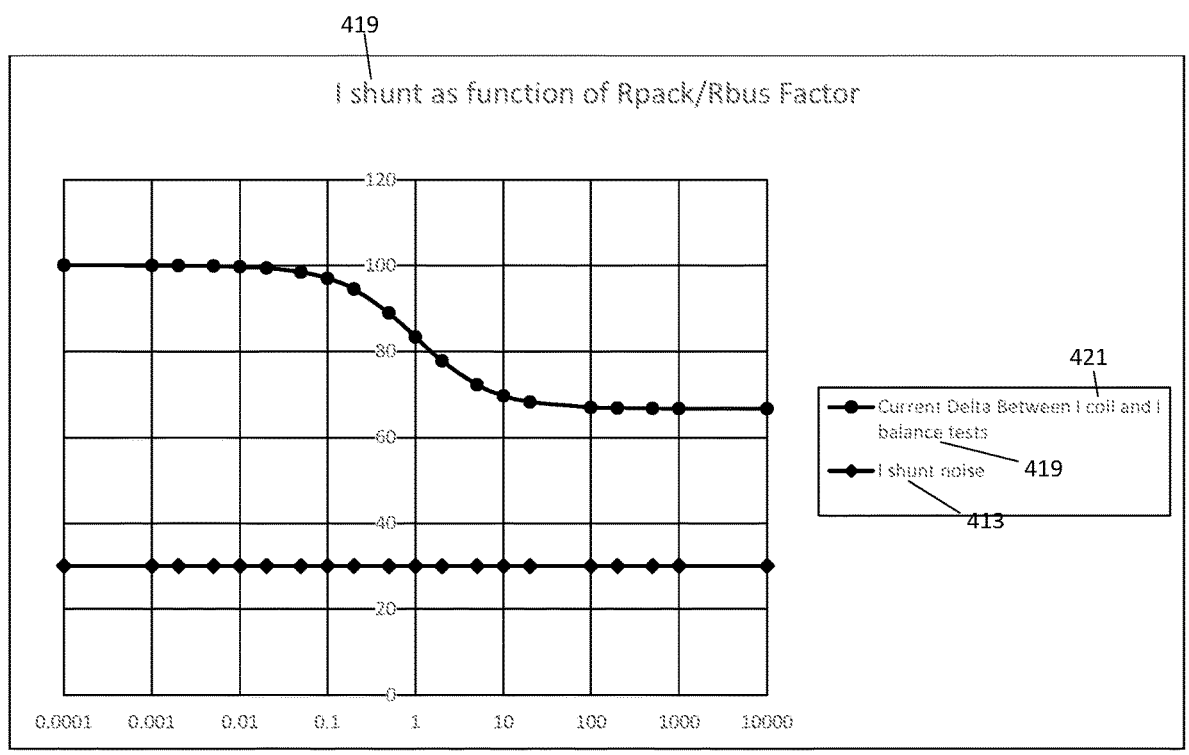
FIG. 6B shows a graph tracking current using a battery system according to one or more examples of embodiments described herein.

As shown in FIG. 6B, the difference in current for I shunt across both the above test (I coil) and the foregoing (supplemental) test described further below (I balance) can be compared using the foregoing system and method as described more fully below. In other words, the current across the fourth resistor (R coil) 421, current across the first battery 409, current across second battery 411, resistance of first resistor 415 and resistance of second resistor 419 may be used to calculate Ishunt (the "I coil" test). Similarly, the current across the third resistor (R balance) 419, current across the first battery 409, current across second battery 411, resistance of first resistor 415 and resistance of second resistor 419 may be used to calculate Ishunt (the "I Balance" test).

Figure 7A:
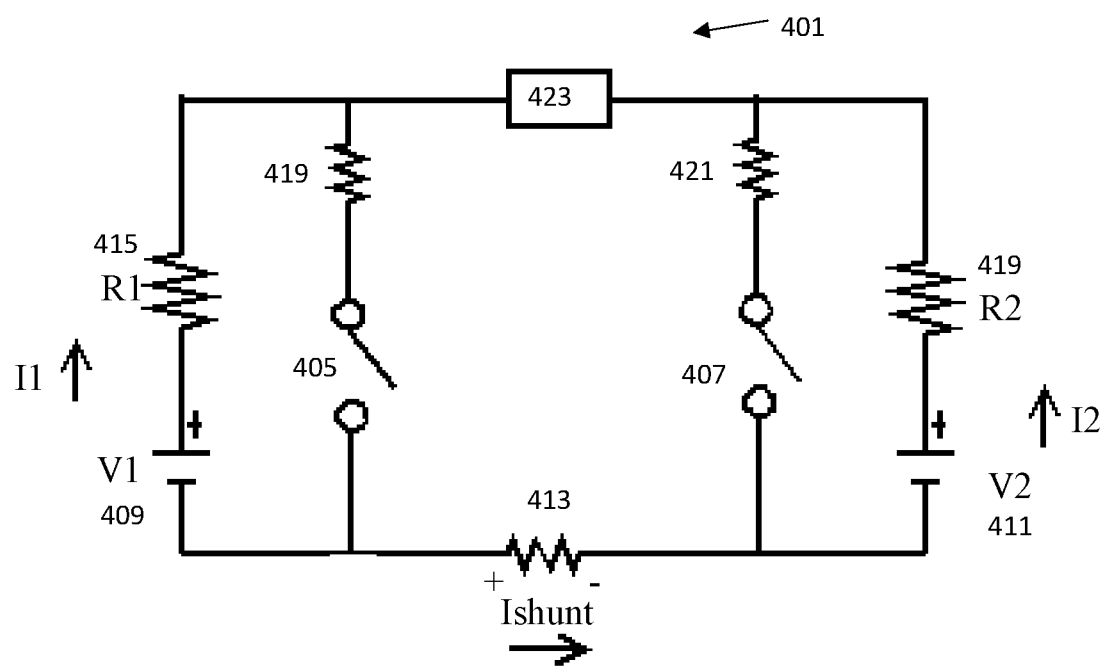
FIG. 7A shows a fourth diagram of a battery system, according to one or more examples of embodiments described herein.
Figure 7B:
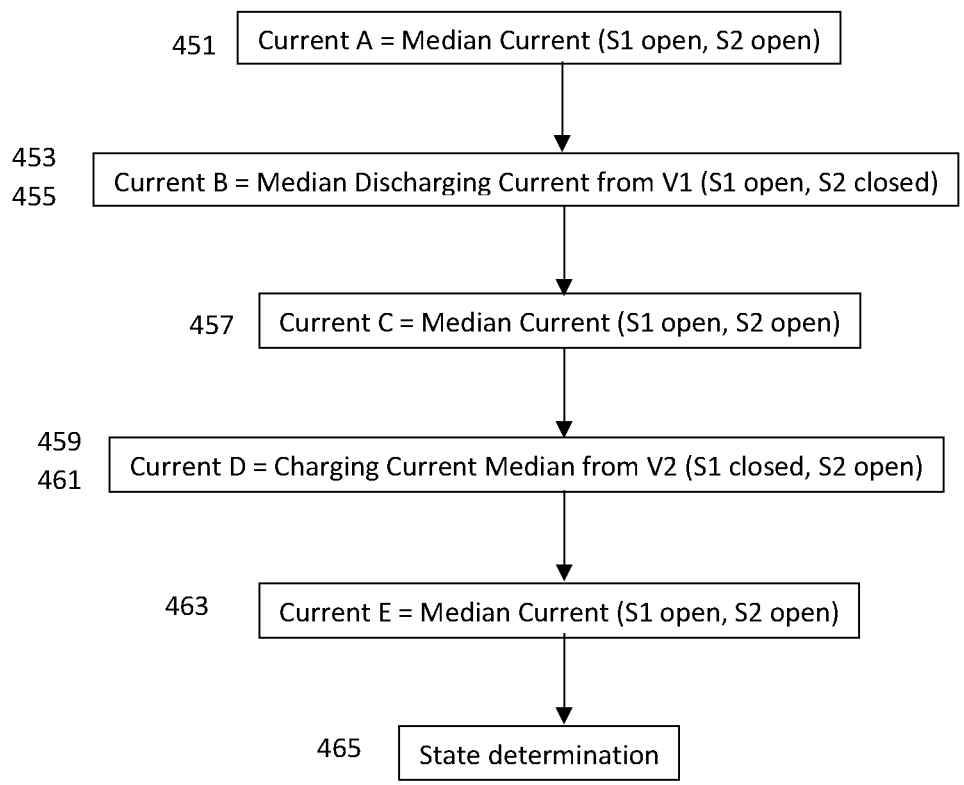
FIG. 7B shows a workflow for use with the diagram of FIG. 7A according to one or more examples of embodiments described herein.

In more detail, FIGS. 7A and 7B show a first circuit and a diagnostic algorithm, respectively. Again, in FIG. 7A, a first voltage source 409, first resistor (load) 417, first switching device 405, and third resistor (load, also known as R balance) can be seen on a first (here, left) side of the circuit relative to the sensor or shunt 413. A relay (circuit breaker such as relay or fuse) 423 can likewise be seen. On the opposite side of the sensor or shunt 413 is a second voltage source 411, second switching device 407, second resistor or load 419, and fourth resistor or load (also known as R coil) which comprise a second side of the circuit or battery system 401. Example currents (I1, I2, Ishunt) for measurement may be seen indicated.

FIG. 7B shows an overview of a series of measurements taken by the system and method herein, for example, using sensor 413 in order to evaluate relay status. The following non-limiting methods may be used in various embodiments of the system herein (while certain steps are described, these steps and their order are non-limiting; permutations thereon should be contemplated as within the scope of this disclosure).

First in step 451 Current A is obtained by obtaining a median current from sensor 413. In this step, controller 424 instructs switch 1 (405) and switch 2 (407) to both be open. In steps 453 and 455, Current B, the median discharging current from V1 409 is obtained. In this step the controller 424 instructs switch 1 (405) to be open and switch 2 (407) to be closed. In step 457, Current C is obtained wherein Current C is the median current again. In this step controller 424 instructs switch 1 (405) and switch 2 (407) to both be open. In steps 459 and 461, Current D is obtained. Current D is the charging current median from V2 411. In this step controller 424 instructs switch 1 (405) to be closed and switch 2 (407) to be open. In step 463, Current E is obtained wherein Current E is the median current again. In this step controller 424 instructs switch 1 (405) and switch 2 (407) to both be open. In step 465, these data are used to determine state.

The following further details expand the steps discussed above. As a general matter, it may be assumed that the relay status diagnostic disclosed herein may be requested when a first voltage source 409 (VPACK, V1) and second voltage source 411 (VBUS, V2) (this may, in various embodiments, be a first and second battery voltage—for example, a lithium ion and a lead acid battery) are similar and battery current is near zero. When requested, the relay status diagnostic nay be performed using the following procedure which may, in various embodiments, constitute a variation or expansion on the description related to FIG. 7B. While specific durations are disclosed, it should be understood shorter and longer durations are within the scope of this disclosure.

In step 451, the controller 424 (which may, in various embodiments, comprise an MCU) may sample battery current for a duration of approximately 5-10 ms, and more particularly approximately 10 ms and take the median of the samples obtained during this period. Let this value be CURRENT_A (Current A may also be understood, for example, as I shunt/I shunt nominal).

In step 453, the controller then may enable the relay status diagnostic load for a duration of approximately 10-30 ms, and more particularly approximately 20 ms. In various embodiments, this step executed by the controller may comprise an MCU sending an SPI command to request that a FPGA enable the relay status diagnostic load for a duration of approximately 10-30 ms, and more particularly approximately 20 ms.

In step 455, while the relay status diagnostics load is enabled, the controller may sample current and obtain median values. In more detail, for example, during the approximately 10-30 ms, and more particularly approximately 20 ms that the FPGA has enabled the relay status diagnostic load, the MCU may sample battery current and take the median of the samples obtained during this period. Let this value be CURRENT_B (Current B may be understood, for example, as I Coil in the figures).

In step 457, the controller samples battery current to obtain a median sample value. In further detail, for example, after the FPGA has disabled the relay status diagnostic load (after approximately 10-30 ms, and more particularly approximately 20 ms), the MCU may sample battery current for a duration of approximately 10 ms and take the median of the samples obtained during this period. Let this value be CURRENT_C (Current C may be understood, for example, as I shunt/I shunt nominal in figures).

In step 459, cell balancing may be performed. In more detail, for example, the MCU may enable cell balancing on a number of balancing circuits (for example, six balancing circuits) for a period of approximately 10-30 ms, and more particularly approximately 20 ms.

In step 461, median currents may again be obtained. In more detail, for example, during the approximately 10-30 ms, and more particularly approximately 20 ms that the MCU has enabled cell balancing, the MCU may sample battery current and take the median of the samples obtained during this period. Let this value be CURRENT_D (Current D may be understood, for example, as I balance in the attached illustrations).

In step 463, a median current may again be obtained, for example, by the controller 424. In more detail, for example, after the MCU has disabled cell balancing (after approximately 10-30 ms, and more particularly approximately 20 ms), the MCU may sample battery current for a duration of approximately 5-10 ms, and more particularly approximately 10 ms and take the median of the samples obtained during this period. Let this value be CURRENT_E (Current E may be understood, for example, as I shunt/I shunt nominal in the figures).

While specific durations are provided, one of skill in the art would understand variations thereon are within the scope of this disclosure. The following logic may be applied to the testing to determine the relay status. This logic is a non-limiting method for determining, for example, relay status using example logic.

The controller 424 which may comprise an MCU, may determine that the relay 423 is closed if the following criteria are met:
1. CURRENT_A, CURRENT_C, and CURRENT_E differ by more than X (approximately 5-20 and more particularly approximately 10 can be used as a placeholder for X) mA.
2. Abs(CURRENT_D-CURRENT_B)—Abs(Mean(CURRENT_A, CURRENT_C, CURRENT_E))>=X (approximately 20-50 and more particularly approximately 40 can be used as a placeholder for X) mA.

The controller 424 which may comprise an MCU, may determine that the relay 423 is open if the following criteria are met:

1. CURRENT_A, CURRENT_C, and CURRENT_E do not differ by more than X (approximately 5-20 and more particularly approximately 10 can be used as a placeholder for X) mA.
2. Abs(CURRENT_D-CURRENT_B)—Abs(Mean (CURRENT_A, CURRENT_C, CURRENT_E))<=X (approximately 20-50 and more particularly approximately 40 can be used as a placeholder for X) mA.

The controller 424 which may comprise an MCU, may determine that the relay 423 is of an indeterminate status if none of the above criteria are met. Again, this example of logic to determine relay status is a non-limiting example. Changes or permutations to the logic should be contemplated as within the scope of this disclosure.

Figure 8:
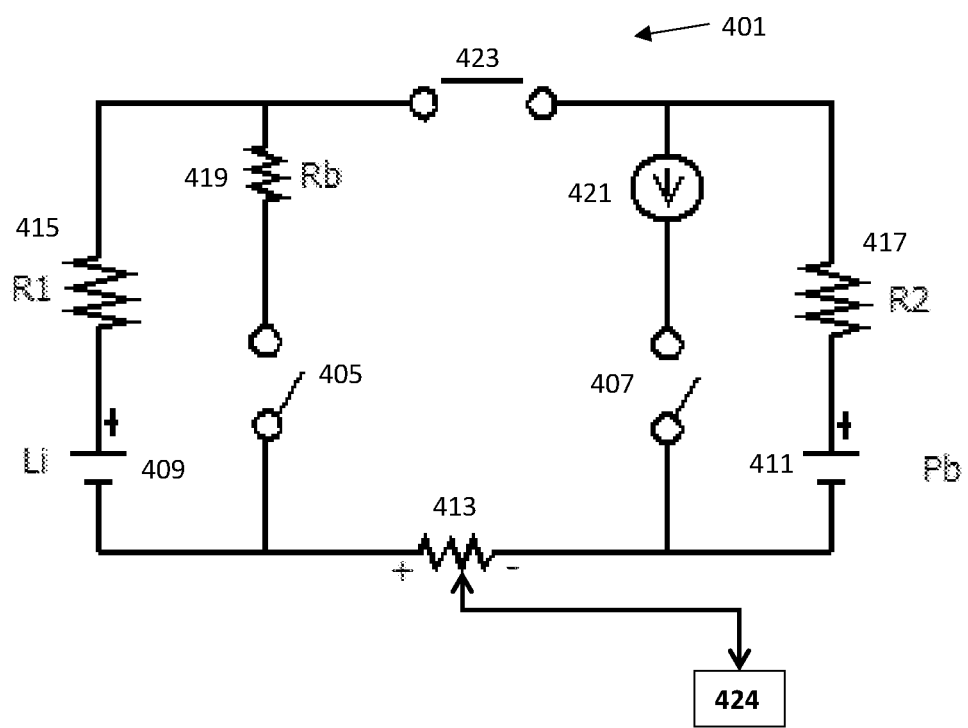
FIG. 8 shows a fifth diagram of a battery system, according to one or more examples of embodiments described herein.

FIG. 8 shows another example electronic system for use with the system and method herein. Again, a first voltage source (shown here as a Lithium Ion battery) 409 may be provided in series with first load 415. Another load 419 may be provided in series with a first switch 405 which may be in parallel with the first voltage source 409 and first resistor 415. A second voltage source (shown here as a Lead-Acid battery) 411 may be provided in series with a second load 417. These may be provided in parallel to a second switching device 407 and additional load 421. Between load 421 and load 419 is shown a circuit breaker (fuse, relay) 423 which may be provided along a BUS. Also provided is a sensor 413 between the first switching device 405 and second switching device 407. The sensor 413 may be in communication with a controller 424. In general, a controller 424 may be in communication with any of the disclosed electrical systems for implementation of the functionality disclosed herein.

Figure 9:
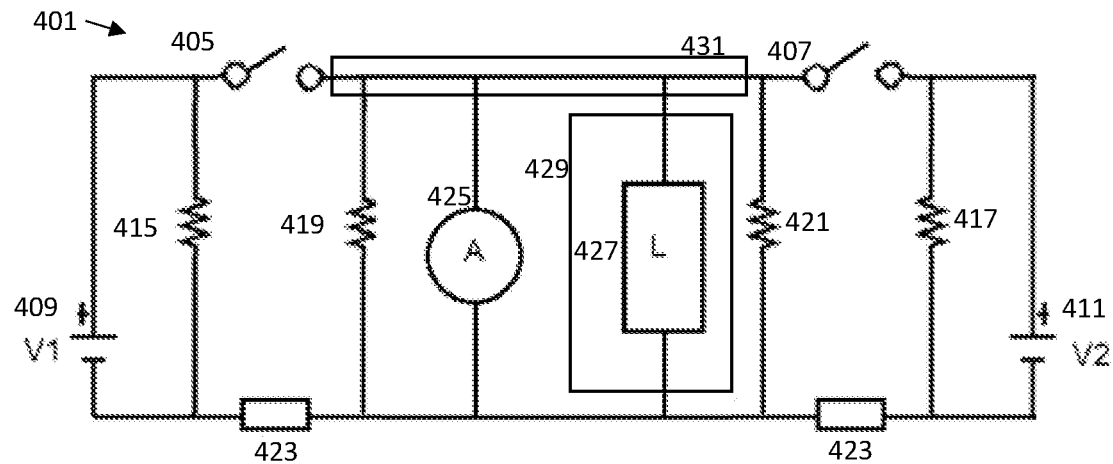
FIG. 9 shows an electrical system for use with the system and method herein, according to one or more examples of embodiments.

FIG. 9 shows a diagram of another example electronic system for use with the system and method herein. Expanding on the prior circuits, an alternator 425 (the alternator may be generally understood as an additional voltage source) and safety load 427 are shown. This load 427 may support safety features in the vehicle. As discussed above, certain loads may be "safety critical" to supporting certain features within a vehicle. Other loads may be of less importance relative to safety. For example, as systems become more autonomous, they may become more power intensive as well as safety critical. In FIG. 9, the safety load supporting part of circuit may be seen 429, and said load support BUS 431. In other words, should the power supply fail on this part of the circuit, vehicle safety may, in various embodiments, be adversely impacted. Therefore, accurate diagnostics and information regarding power source availability (for example, by way of circuit breaker/relay 423) may be important.

Safety and chassis functionality of a vehicle may be further classified using an Automotive Safety Integrity Level (ASIL). (ASIL D may be understood to be the highest integrity requirements, ASIL A lowest). For each of these components, there is a corresponding need to supply power to them with some ASIL integrity level such as ASIL D. This standard may include requiring a low level of current and redundancy for power support. In addition, autonomous functionality features may require safety critical peak current loads (>100, 200 A). This may include a combination of the power sources. These safety critical controllers and higher power peak loads may be all provided on the same network; therefore a failure of the overall vehicle power sources to provide a peak load also could create a loss of power to the safety critical controllers. Therefore diagnostics in particular regarding the relay status may, in various embodiments, regularly confirm functioning of the battery relay control ensuring that the battery is connected (relay closed, fuse connected) and able to provide power.

Figure 10:
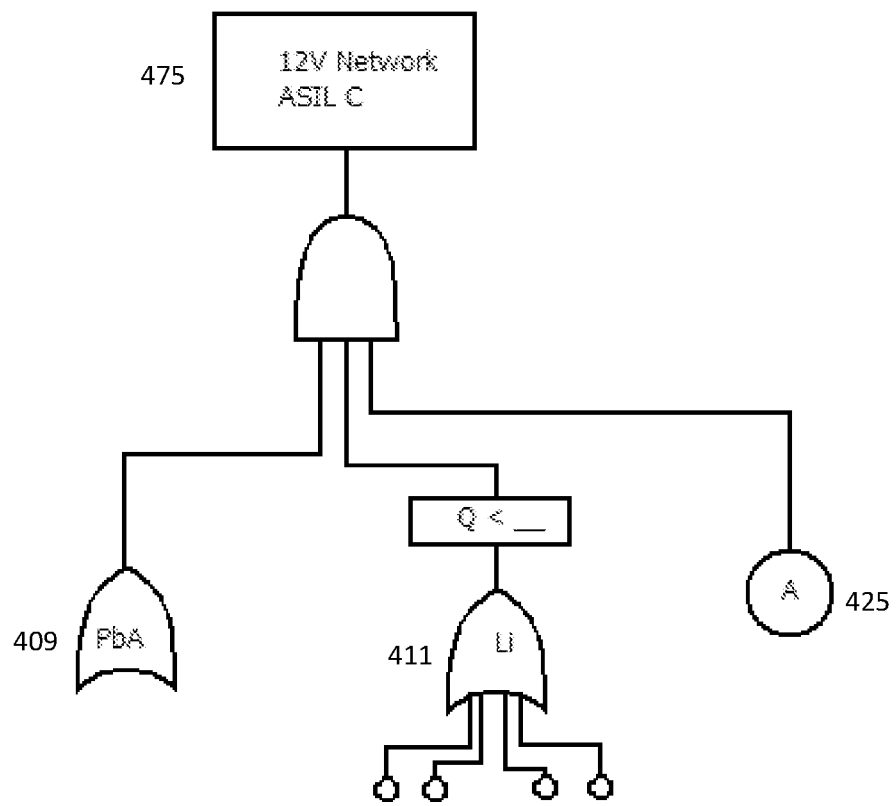
FIG. 10 shows a diagram of a battery system showing loads, according to one or more examples of embodiments.

FIG. 10 shows a 12 V network 475 which may, in various embodiments, be used to support an ASIL C power integrity requirement load. The system may include a first battery 409 (which may comprise a lead-acid battery), a second battery 411 supporting a number of features and having a particular quality factor (Q<_), and an alternator 425.

Figure 11:
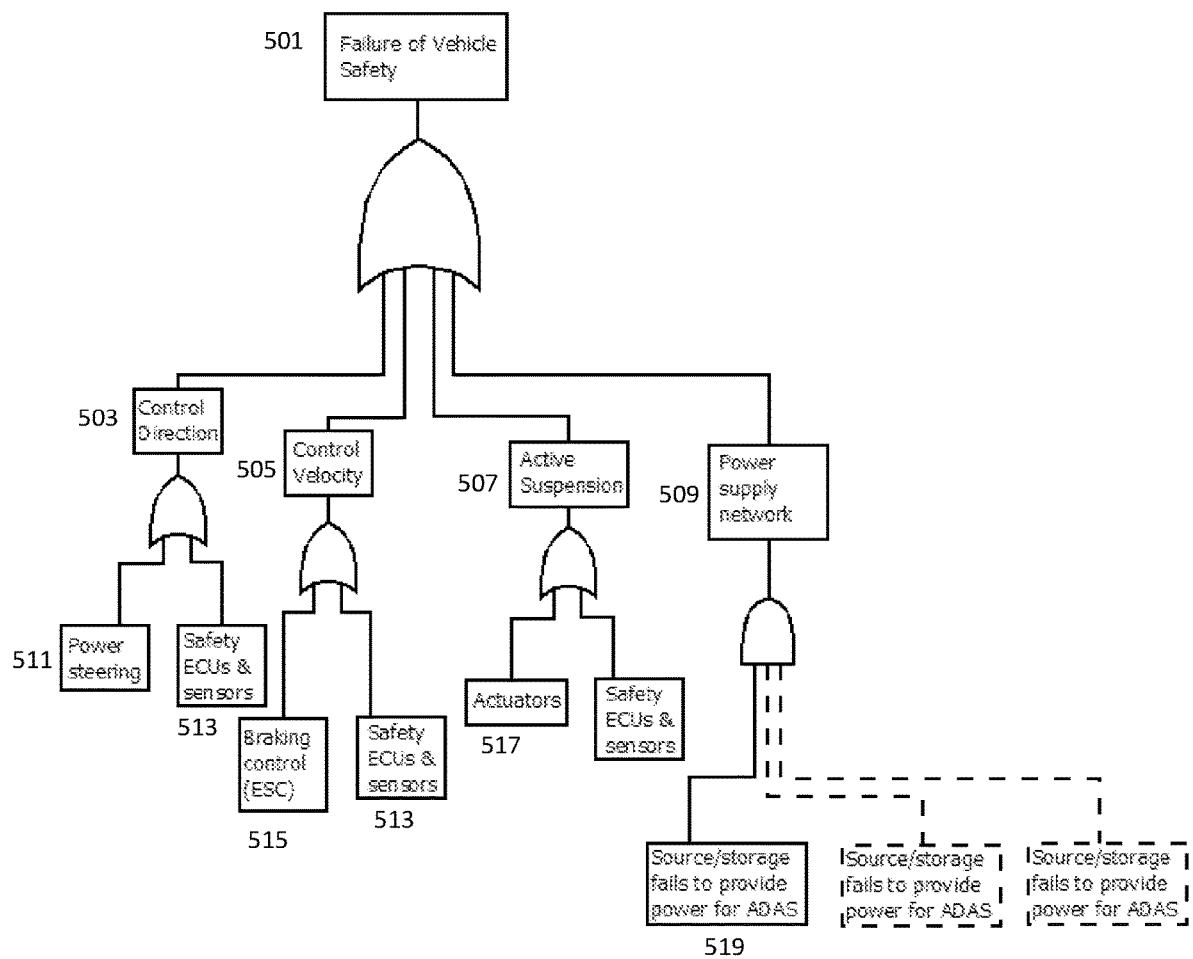
FIG. 11 shows a diagram of failure of vehicle safety components.

FIG. 11 shows a diagram depicting possible areas for failure of vehicle safety 501. Systems for controlling direction 503 including power steering 511 and associated safety ECUs and sensors 513 may present a failure opportunity for vehicle safety. Next, systems for controlling velocity 505 including braking control (ESC) 515 and associated safety ECUs and sensors 513 may present another failure opportunity for vehicle safety. Systems for supporting an active suspension 507 including actuators 517 and associated safety ECUs and sensors 513 may likewise present a failure opportunity for vehicle safety. Finally, power supply network 509 supported systems including source/storage failures to provide power for ADAS (advanced driver-assistance systems) 519 may present a failure opportunity for vehicle safety.

Therefore, it should be understood that the disclosed system and method may allow for improved accuracy regarding battery diagnostics. In particular, in various embodiments, the disclosed system and method may allow for improved accuracy of relay status. Relay status may allow the system to indicate availability of one or more power supplies.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that references to relative positions (e.g., "top" and "bottom") in this description are merely used to identify various elements as are oriented in the Figures. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the system, methods, and devices as shown in the various examples of embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements show as multiple parts may be integrally formed, the operation of the interfaces may be reversed or otherwise varied, the length or width of the structures and/or members or connector or other elements of the system may be varied, the nature or number of adjustment positions provided between the elements may be varied (e.g. by variations in the number of engagement slots or size of the engagement slots or type of engagement). The order or sequence of any process or method steps may be varied or re-sequenced according to alternative embodiments. Other substitutions, modifications, changes and omissions may be made in the design, operating conditions and arrangement of the various examples of embodiments without departing from the spirit or scope of the present inventions.

While this invention has been described in conjunction with the examples of embodiments outlined above, various alternatives, modifications, variations, improvements and/or substantial equivalents, whether known or that are or may be presently foreseen, may become apparent to those having at least ordinary skill in the art. Accordingly, the examples of embodiments of the invention, as set forth above, are intended to be illustrative, not limiting. Various changes may be made without departing from the spirit or scope of the invention. Therefore, the invention is intended to embrace all known or earlier developed alternatives, modifications, variations, improvements and/or substantial equivalents.

The technical effects and technical problems in the specification are exemplary and are not limiting. It should be noted that the embodiments described in the specification may have other technical effects and can solve other technical problems.

We claim:

1. An electrical system comprising:
    a battery system comprising:
        a first switching device;
        a first battery electrically coupled in series with the first switching device;
        a second battery electrically coupled in parallel with the first switching device and the first battery when the first switching device is in a closed position; and
        a second switching device coupled in series with a load;
    a control system configured to perform diagnostics on the battery system, the control system is configured to:
        instruct the second switching device to close to electrically couple the second switching device and the load in parallel with the second battery; and
        determine an actual position of the first switching device based at least in part on current flow through the first battery while the second switching device is closed;
    wherein the control system is configured to instruct the second switching device to close when the battery system is in a steady-state, wherein the current flow through the first battery is approximately zero when the first switching device is in the closed position and the battery system is in the steady-state.

2. The electrical system of claim 1, wherein the load comprises a relay coil of the first switching device.

3. The electrical system of claim 1, wherein the actual position of the first switching device can be used to determine whether the first battery and/or the second battery is available for use by a vehicle.

4. A vehicle having the electrical system of claim 3.

5. The vehicle of claim 4, wherein the electrical system is used to evaluate whether safety-critical functionality can be supported by the first battery and/or the second battery.

6. An electrical system comprising:
    a battery system comprising:
        a first switching device;
        a first battery electrically coupled in series with the first switching device;
        a second battery electrically coupled in parallel with the first switching device and the first battery when the first switching device is in a closed position; and
        a second switching device coupled in series with a load;
    a control system configured to perform diagnostics on the battery system, the control system is configured to:
        instruct the second switching device to close to electrically couple the second switching device and the load in parallel with the second battery; and
        determine an actual position of the first switching device based at least in part on current flow through the first battery while the second switching device is closed; and
    a current sensor coupled in series with the first switching device;
    wherein the control system is configured to determine the actual position of the first switching device based at least in part on a sensor signal received from the current sensor.

7. The electrical system of claim 6, wherein the current sensor comprises a shunt resistor.

8. The electrical system of claim 6, wherein the actual position of the first switching device can be used to determine whether the first battery and/or the second battery is available for use by a vehicle.

9. A vehicle having the electrical system of claim 8.

10. The vehicle of claim 9, wherein the electrical system is used to evaluate whether safety-critical functionality can be supported by the first battery and/or the second battery.

11. The electrical system of claim 6, wherein the control system is configured to instruct the second switching device to close when the battery system is in a steady-state, wherein the current flow through the first battery is approximately zero when the first switching device is in the closed position and the battery system is in the steady-state.

12. The electrical system of claim 6, wherein the load comprises a relay coil of the first switching device.

13. An electrical system comprising:
    a battery system comprising:
        a first battery having a positive terminal and a negative terminal;
        a first switching device electrically coupled in series with a first load;
        a second switching device electrically coupled in series with a second load;
        a second battery having a positive terminal and a negative terminal;
        a sensor electrically coupled between the negative terminal of the first battery and the negative terminal of the second battery; and
        a relay electrically coupled between the positive terminal of the first battery and the positive terminal of the second battery;
    wherein the first battery is electrically coupled in parallel with the first switching device and the first load, the second battery is electrically coupled in parallel with the second switching device and the second load, the sensor is electrically coupled between the first switching device and second switching device, and the relay is electrically coupled between the first switching device and the second switching device; and a control system configured to perform diagnostics on the battery system, the control system is configured to determine relay status by obtaining a number of measurements of current across the battery system.

14. The electrical system of claim 13, wherein the sensor is a current sensor which comprises a shunt resistor.

15. The electrical system of claim 13, wherein the measurements include:
   obtaining first current measurement while the first switching device and second switching device are both in an open state;
   obtaining a second current measurement while the first switching device is closed and the second switching device is open;
   obtaining a third current measurement while the first switching device is open and the second switching device is closed.

16. The electrical system of claim 13, wherein the relay status can be used to determine whether a battery is available for use by a vehicle.

17. A vehicle having the electrical system of claim 13.

18. The vehicle of claim 17 further comprising advanced driver functionality.

19. The vehicle of claim 17, wherein the electrical system is used to evaluate whether safety-critical functionality can be supported by the first battery and/or the second battery.

* * * * *

UNITED STATES PATENT AND TRADEMARK OFFICE
CERTIFICATE OF CORRECTION

PATENT NO. : 11,460,503 B2  
APPLICATION NO. : 16/606122  
DATED : October 4, 2022  
INVENTOR(S) : Johnson et al.

Page 1 of 2

It is certified that error appears in the above-identified patent and that said Letters Patent is hereby corrected as shown below:

On the Title Page

1. In Item (56), under "OTHER PUBLICATIONS", in Column 2, Line 1, delete "international" and insert -- International --, therefor.

In the Specification

2. In Column 6, Lines 4-5, delete "first switching device 203" and insert -- first switching device 205 --, therefor.

3. In Column 6, Line 7, delete "first switching device 203" and insert -- first switching device 205 --, therefor.

4. In Column 6, Line 14, delete "first switching device 203" and insert -- first switching device 205 --, therefor.

5. In Column 6, Lines 27, delete "due energy" and insert -- due to energy --, therefor.

6. In Column 6, Line 57, delete "in battery" and insert -- in the battery --, therefor.

7. In Column 7, Line 5, delete "second switching device 211" and insert -- second switching device 207 --, therefor.

8. In Column 7, Lines 19-20, delete "first switching device 209" and insert -- first switching device 205 --, therefor.

9. In Column 9, Line 14, delete "determine actual" and insert -- determine the actual --, therefor.

10. In Column 9, Line 52, delete "than that" and insert -- that are --, therefor.

Signed and Sealed this  
Ninth Day of April, 2024

Katherine Kelly Vidal  
*Director of the United States Patent and Trademark Office*

CERTIFICATE OF CORRECTION (continued)
U.S. Pat. No. 11,460,503 B2

11. In Column 9, Line 54, delete "420 load" and insert -- 420 loads --, therefor.

12. In Column 9, Line 60, delete "may performed" and insert -- may be performed --, therefor.

13. In Column 10, Line 36, delete "side 411" and insert -- side 411) --, therefor.

14. In Column 10, Line 64, delete "second resistor 419" and insert -- second resistor 417 --, therefor.

15. In Column 11, Lines 1-2, delete "second resistor 419" and insert -- second resistor 417 --, therefor.

16. In Column 11, Line 6, delete "first resistor (load) 417," and insert -- first resistor (load) 415, --, therefor.

17. In Column 11, Lines 13-14, delete "second resistor or load 419," and insert -- second resistor or load 417, --, therefor.

18. In Column 11, Line 50, delete "diagnostic nay" and insert -- diagnostic may --, therefor.

19. In Column 15, Line 7, delete "show as" and insert -- shown as --, therefor.

In the Claims

20. In Column 17, Line 27, in Claim 18, delete "claim 17" and insert -- claim 17, --, therefor.